June 10, 1969 W. G. EINTHOVEN 3,449,646
HIGH-VOLTAGE TRANSISTOR WITH CONTROLLED BASE AND
COLLECTOR DOPING AND GEOMETRY
Filed Oct. 18, 1966

INVENTOR.
WILLEM G. EINTHOVEN
BY
Frank R. Trifari
AGENT

United States Patent Office 3,449,646

Patented June 10, 196

3,449,646

HIGH-VOLTAGE TRANSISTOR WITH CONTROLLED BASE AND COLLECTOR DOPING AND GEOMETRY

Willem Gerard Einthoven, Nijmegen, Netherlands, assignor, by mesne assignments, to U.S. Philips Corporation, New York, N.Y., a corporation of Delaware Filed Oct. 18, 1966, Ser. No. 587,456
Claims priority, application Netherlands, Oct. 22, 1965, 6513666
Int. Cl. H01l *11/00*
U.S. Cl. 317—235 11 Claims

ABSTRACT OF THE DISCLOSURE

A high-voltage transistor comprising a high band-gap semiconductor having a base zone thickness of 15–60 microns and a base impurity concentration exceeding $2\times10^{12}$ per cm.$^2$, and a high resistance collector zone having a thickness of 80–300 microns and a collector impurity concentration equal to or less than $2.5\times10^{14}$ per cm.$^3$.

Figure 1:
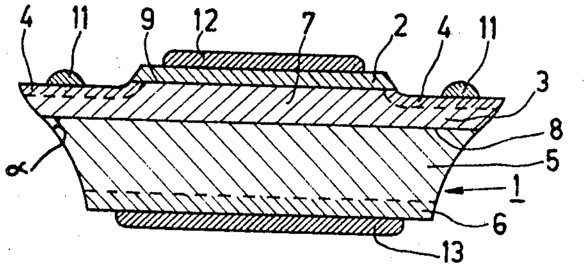

The invention relates to a high-voltage transistor comprising a semiconductor body having a width of the forbidden band which is at least equal to that of silicon and an emitter-, base- and collector zone, the collector zone comprising a high-resistivity collector layer adjoining the base-collector junction. . .

Known high-voltage transistors have at most a base-collector breakdown voltage of approximately 700 volt. Although theoretically a very much high base-collector breakdown voltage must be possible and a base-collector breakdown voltage which is much higher than 700 volt is continuously aimed at, it has not yet succeeded to provide useful high-voltage transistors having a base-collector breakdown voltage exceeding approximately 700 volt.

It is the object of the invention to provide inter alia a structure for a high-voltage transistor in which base-collector breakdown voltages up to more than 2000 volt are possible with an amplification factor sufficiently large to use the transistor, for example, in the output stage of an amplifier of a radio or television set.

Another object of the invention is to provide a high-voltage transistor which is suitable for use in a circuit arrangement for producing a sawtooth current through the horizontal deflection coil of a picture tube, of the type described in a copending Dutch patent application Ser. No. 579,539, filed Sept. 15, 1966.

The invention is based inter alia on the following considerations and recognitions.

During operation in which the base-collector junction is biased in the reverse direction, a space charge region extends from the base-collector junction in the collector zone over a much larger distance than in the base zone as a result of the presence of a high-resistivity collector layer. In this case the base-collector voltage is set up for the greater part across the space charge region in the collector zone, while only a small part of this voltage is set up across the space charge region in the base zone. This makes the use of a thin base zone possible.

However, in practice it has often not been realized, or at least to an insufficient extent, that, although from the base-collector junction a space charge region is formed in the collector zone over a much larger distance than in the base zone, in which the base-collector voltage is set up for the greater part across the space charge region in the collector zone, the total space charge in the two space charge regions must nevertheless be equal. In addition, with an increasing base-collector voltoge an increas ing total space charge occurs in the space charge region Therefore, in designing a high-voltage transistor th fact should be taken into account that the base zon must contain sufficient impurities determining the con ductivity type to enable the building up of a large spac charge over a short distance from the base-collecto junction.

In the space charge regions the largest field strengt occurs at the base-collector junction surface. If sai field strength becomes too large, breakdown occurs. Fo example, in a silicon semiconductor body the fiel strength may increase to approximately 20 v./$\mu$ befo breakdown occurs. Such high field strengths, howeve usually do not occur in known high-voltage transistor breakdown occurs already at much lower field strengt as a result of variety of causes, for example, in that space-charge region reaches the emitter zone or the ba contact. This often is associated with the fact that, practice, it has not sufficiently been realized that a equally large space charge occurs in the base zone as the collector zone.

Calculations carried out in connection with the inve tion have proved that the maximum field strength at t base-collector junction surface can be reached only if t base zone, viewed in the direction of its thickness, co tains approximately $2\times10^{12}$, or more, impurities dete mining the conductivity type per cm.$^2$.

It has further been found that to avoid effects, for e ample, the Early effect, which have an adverse influenc for example, on the characteristic which is obtained the emitter-collector voltage is plotted against the co lector current, it is desirable that the base zone contai more than $2\times10^{12}$ impurities determining the condu tivity type per cm.$^2$.

The invention is further based on the recognition the fact that the use of a base zone, which is as th as possible and which in general is aimed at in sem conductor technology, is particularly unfavourable a high-voltage transistor. Instead of a base region havi a thickness of a few microns, a much thicker base zo is desired for a high-voltage transistor. In fact, it m easily occur that during operation the current flowi through the base-collector junction locally shows a co centration which, as a result of the large voltage diffe ence across the said junction, may be associated with rather large local increase in temperature. It must avoided that as a result of this the base-emitter juncti like-wise locally reaches a higher temperature, since t gives rise to effects which may cause a considerable d crease of the maximum permissible emitter-collect voltage, so that the possibilities of using the transist are limited. It has been found that by using a thick ba zone, having a thickness of at least 15$\mu$, said effe can be avoided, at least for the greater part.

In using a base zone, the thickness of which is mo than approximately 60$\mu$, it is substantially impossible obtain a useful transistor.

In addition a very thick high resistivity collector la is required to enable a very high voltage difference acr the space charge region occurring during operation the collector layer and consequently base-collec voltages of approximately 800 volts to more than 20 volts.

According to the invention, a high-voltage transis comprising a semiconductor body having a width of forbidden band which is at least equal to that of silic and an emitter-, base- and collector zone, the collec zone comprising a high-resistivity collector layer adjo ing the base collector junction, is characterized in t the high-resistivity collector layer contains maxima $2.5 \times 10^{14}$ impurities determining the conductivity type per cu.cm. and has a thickness which is at least equal to $80\mu$ and at most equal to $300\mu$, the base zone, viewed in the direction of its thickness, containing more than $2 \times 10^{12}$ impurities determining the conductivity type per sq.cm. and at least the part of the base zone located between the emitter zone and the collector zone having a thickness of at least $15\mu$ and at most $60\mu$.

The high-voltage transistor according to the invention preferably is a diffusion transistor, that is to say a transistor having a base zone obtained by diffusion of an impurity. In diffusion transistors the semiconductor body of the transistor in fact consists for the greater part of the collector zone which is favourable with a view to the necessary very thick high-resistivity collector layer. It has been found in addition that the thick base zone with the desired doping can best be obtained by a diffusion method in which in a surprisingly simple manner a sufficiently long life for minority carriers in the base zone can be obtained as will be described in greater detail below. In fact, in view of the large thickness of the base zone, a long life of the minority carriers in the base zone is necessary to give the transistor a useful amplification factor.

An important embodiment of a high-voltage transistor according to the invention is characterized in that the whole emitter-base junction extends substantially parallel to the collector-base junction, said junctions being substantially flat. In this embodiment the emitter zone preferably has a smaller area than the base zone, the emitter zone extending entirely above the base zone. This latter configuration enables in a simple manner the manufacture of a transistor the whole emitter-base junction of which extends substantially parallel to the collector-base junction. For example, the emitter zone may simply be provided by first providing a surface layer by diffusion of an impurity after which by local removal, for example by etching said surface layer, locally an emitter zone extending above the base zone is obtained with the desired shape of the emitter base junction. In this case it is possible only to locally remove the emitter zone readily by also removing the base zone over part of its thickness. As a result of this, the part of the base zone located below the emitter zone is thicker than the remainder of the base zone. This has the advantage inter alia that in this remaining part of the base zone the space where accumulation of charge carriers can take place, by which the cut-off frequency is reduced, is restricted.

In the commonly used transistors, the emitter zone usually consists of a zone which is locally provided in the base zone, for example, by local diffusion or alloying. In these transistors the emitter-base junction is approximately cup-shaped, the edge portions of said junction being farthest remote from the collector-base junction. It has been found that during operation charge carriers are often injected mainly from the emitter zone into the base zone through said edge portions located farthest remote from the collector-base junction. This would be unfavourable in particular in a high-voltage transistor according to the invention having a base zone which is thick as it is, and would have, for example, an adverse influence on the amplification factor. Therefore, in the said important embodiment a cup-shaped emitter-base junction is avoided.

To obtain a low base resistance and to make it substantially impossible that during operation the space charge region extending in the base zone reaches the base contact, the base zone preferably comprises, at its surface not covered by the emitter zone, a surface layer which is obtained by diffusion of an impurity and has a lower resistivity than the remaining part of the base zone, on which surface layer the base contact is provided.

As already explained, an emitter zone obtained by diffusion of an impurity may advantageously be used.

As already described, the base zone must have a thickness which is at least equal to $15\mu$ and at most equal to $60\mu$. The most favourable results, however, are obtained with a base zone of which at least the part which is located between the emitter zone and the collector zone has a thickness between 20 and $55\mu$.

In order to substantially avoid effects, for example the Early effect, the base zone, viewed in the direction of its thickness, preferably comprises at least $10^{13}$ impurities determining the conductivity type per sq.cm.

The high-ohmic collector layer preferably has a thickness which is at least equal to $100\mu$ and at most equal to $250\mu$, the concentration of the impurities determining the conductivity type in the high-resistivity collector layer preferably being at most $1.6 \times 10^{14}$ impurities per cu.cm. A favourable ratio between the base-collector breakdown voltage and the collector series resistance is possible in this case for the high-voltage transistor.

The invention also relates to a method of manufacturing a high-voltage transistor according to the invention.

In the manufacture of a high-voltage transistor according to the invention, special care should be taken to obtain a sufficiently long lifetime of the minority carriers in the base zone, to enable a sufficient amount of minority carriers injected by the emitter in the base zone to reach the collector through the thick base zone.

It has been found that when using the normal diffusion methods during the manufacture of a high-voltage transistor according to the invention, a sufficiently long lifetime of the minority carriers in the base zone is not obtained. It has surprisingly been found that the desired long lifetime of the minority carriers can simply be obtained by very slowly cooling the semiconductor body at least after the last diffusion process to be carried out during the manufacture.

Therefore, according to the invention, a method of manufacturing a high-voltage transistor according to the invention in which a semiconductor body is used as a starting material in which at least one of the regions consisting of the base zone, the surface layer of the base zone and the emitter zone is provided by a diffusion treatment at a diffusion temperature exceeding 1000° C. followed by cooling the semiconductor body, is characterized in that at least after the last diffusion treatment the semiconductor body is slowly cooled at a rate of at most 20° C. per minute, at least to a temperature between 600° C. and 1000° C.

Particularly favourable results are obtained when the semiconductor body is slowly cooled at a rate of at most 3° C. per minute, while cooling is preferably carried out slowly to at least a temperature of 850° C.

Although slow cooling after the last diffusion treatment is most important, the best results are obtained all the same, if during the manufacture of the high-voltage transistor the slow cooling of the semiconductor body is effected after each diffusion treatment.

In this case it is recommendable, at least in the last diffusion treatment, to heat the semiconductor body slowly from a temperature between 600° C. and 1000° C. to the diffusion temperature at approximately the same rate at which the semiconductor body is cooled slowly after the diffusion treatment.

Figure 2:
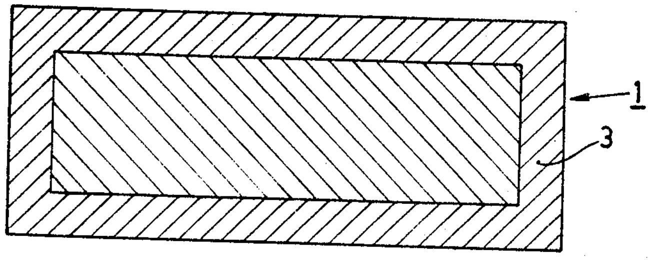
Figure 3:
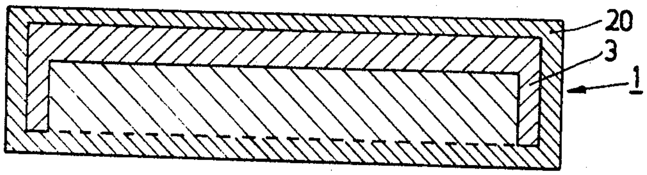
Figure 4:
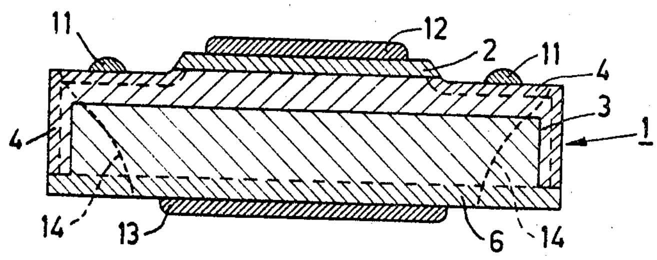

In order that the invention may readily be carried into effect, a few embodiments thereof will now be described in greater detail, by way of example with reference to the accompanying drawing, in which:

FIGURE 1 is a diagrammatic cross-sectional view of an embodiment of a high-voltage transistor according to the invention, FIGURES 2 to 4 show the high-voltage transistor shown in FIGURE 1 in various stages during a method of manufacturing the high-voltage transistor.

Figure 5:
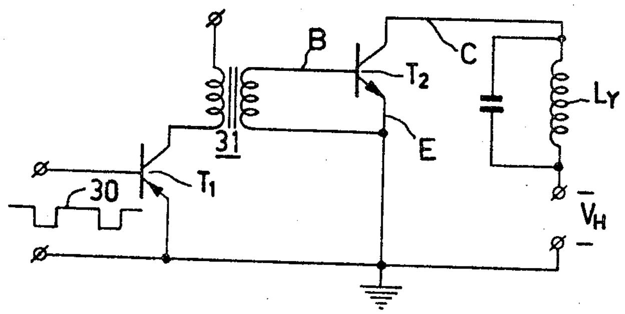

FIGURE 5 diagrammatically shows a circuit arrangement in which the high-voltage transistor according to the invention may advantageously be used.

The example of high-voltage transistor shown in FIGURE 1 comprises a semiconductor body 1 having a width of the forbidden band gap which is at least equal to that of silicon and an emitter zone 2, a base zone 3, 4 and a collector zone 5, 6, the collector zone 5, 6 comprising a high-resistivity collector layer 5 adjoining the base-collector junction 8.

In the present example, the semiconductor body 1 is of silicon.

According to the invention, the high-ohmic collector layer 5 comprises at most $2.5\times10^{14}$ impurities determining the conductivity type per cu. cm., while the thickness of said layer 5 is at least $80\mu$ and at most $300\mu$. Viewed in the direction of its thickness the base zone 3, 4 further comprises more than $2\times10^{12}$ impurities determining the conductivity type per sq. cm. at least the part 7 of the base zone located between the emitter zone 2 and the collector zone 5, 6 having a thickness which is at least equal to $15\mu$ and at most equal to $60\mu$.

As a result of this, base-collector breakdown voltages of approximately 800 volts to more than 2000 volts are possible together with a sufficiently large amplification factor to use the transistor, for example, in the output stage of amplifiers of radio and television sets.

Both the base zone 3, 4 and the emitter zone 2 are zones which are obtained by diffusion of an impurity. This has the advantage inter alia that during the manufacture it can easily be ensured in providing said zones that a sufficiently long lifetime of the minority carriers in the base zone occurs, as will be explained in greater detail below.

The emitter zone 2 has a smaller area than the base zone 3, 4 and extends entirely above the base zone 3, 4. This configuration enables in a simple manner the substantially parallel and substantially flat base-collector and base-emitter junctions 8 and 9, respectively.

Although the emitter zone may consist, for example, of a zone obtained by local diffusion or by alloying, which zone is sunk in the base zone and in which the edge or marginal portions of the base-emitter junction bend in a direction away from the base-collector junction, the said flat parallel junctions 8 and 9 are to be preferred in view to the thick base zone since in that case the marginal portions of the base-emitter junction 9, through which marginal portions during operation a great part of the charge carriers to be injected are injected into the base zone 3, 4, are not the parts located farthest from the base-collector junction 8.

On the surface of the base zone 3, 4 not covered by the emitter zone 2 a surface layer 4 is provided which is obtained by diffusion of an impurity and has a lower resistivity than the remaining part 3 of the base zone 3, 4, on which surface layer 4 the annular base contact 11 is provided. Said surface layer 4 reduces the base resistance and makes it substantially impossible that during operation the space charge region extending in the base zone 3, 4 can reach the contact 11.

The high-ohmic collector layer 5 preferably has a thickness of at least equal to $100\mu$ and at most equal to $250\mu$, the concentration of impurities determining the conductivity type preferably being at most $1.6\times10^{14}$ impurities per cu.cm. In this case the most favourable ratios between base-collector breakdown voltage and collector series resistance are possible. In the present example, the high-resistivity collector layer 5 has a thickness of approximately $120\mu$ and contains approximately $1.4\times10^{14}$ impurities determining the conductivity type per cu.cm.

As already said, very favourable results are obtained with a thickness of the base zone between 20 and $55\mu$. The base zone 3, 4 has a thickness of approximately $30\mu$ between the emitter zone 2 and the collector zone 5, 6.

In addition, the base zone 3, 4, viewed in the direction of its thickness, contains more than $10^{13}$ impurities determining the conductivity type per sq. cm., effects, for example, the Early effect, being substantially avoided.

The transistor shown in FIGURE 1 is manufactured as follows:

The starting material is a semiconductor body in the form of a disc-shaped n-type silicon wafer having a thickness of approximately $250\mu$ and a diameter of approximately 6.4 mm. The resistivity is approximately 35 ohm cm. which means that approximately $1.4\times10^{14}$ impurities determining the conductivity type per cu. cm. are present.

The regions consisting of the base zone 3 with the surface layer 4, and the emitter zone 2 are provided by a diffusion treatment at a diffusion temperature exceeding 1000° C. after which the semiconductor body is cooled.

At least after the last diffusion treatment the semiconductor body is slowly cooled at a rate of maximally 20° C. per minute. The slow cooling is carried out until at least a temperature between 600° C. and 1000° C. is reached. Then a more rapid, for example, a natural cooling may take place. As a result of this a sufficiently long life of the minority carriers in the thick base zone is obtained.

Cooling is effected preferably at a rate of maximally 3° C. per minute and at least to a temperature of 850° C.

First a p-type surface layer 3 (see FIGURE 2) is provided in the semiconductor body 1. For this purpose, the semiconductor body is embedded in aluminum oxide and heated to approximately a diffusion temperature of 1240° C., the semiconductor body being heated to a temperature of approximately 800° C. at a rate of approximately 20° C. per minute and then at a rate of approximately 2° C. per minute to the diffusion temperature. The semiconductor body is kept at the diffusion temperature of approximately 1240° C. for approximately 2 hours and then cooled to a temperature of approximately 800° C. at a rate of approximately 2° C. per minute, and then to room temperature at a rate of approximately 20° C. per minute. The heating cycle is carried out in a hydrogen atmosphere.

The resulting p-type layer 3 has a thickness of approximately $30\mu$ and a surface concentration of approximately $10^{18}$ acceptors per cu. cm. consisting of aluminum.

The p-type layer 3 is removed on the lower side of the wafer 1, for example, by polishing and/or etching, after which the n-type surface layer 20 (see FIGURE 3) is provided.

For this purpose the semiconductor body 1 together with a quantity of $P_2O_5$ is placed in a furnace in which the semiconductor body 1 is kept at a diffusion temperature of approximately 1240° C. for approximately [illegible] hours, while passing dry oxygen, the $P_2O_5$ being kept at a temperature of approximately 300° C. Heating and cooling of the semiconductor body is effected as described in the preceding diffusion treatment.

The resulting surface layer 20 has a thickness of approximately $18\mu$ and a surface concentration exceeding $10^{20}$ donors per cu. cm. consisting of phosphorus.

The lower side of the wafer and a circular part having a diameter of approximately 3.6 mm. of the upper surface is covered with a masking means, after which the parts of the layer 20 not covered by the mask, are removed by etching. Then the configuration shown in FIGURE 4 is obtained having the two remaining parts 2 and 6 of the layer 20. The masking and etching may be effected in a manner commonly used in semiconductor technology. During the removal of parts of the layer [illegible] also an adjoining part of the layer 3 is removed. A layer approximately 25 microns thick, is removed by etching.

The p-type surface layer 4 is then provided by diffusion of gallium.

For the purpose the semiconductor body 1 is embedded in gallium-doped silicon powder and kept at a diffusion temperature of approximately 1240° C. in a hydrogen atmosphere for approximately 30 minutes, a quantity of gallium being present in the immediate proximity of the semiconductor body. Heating and cooling is effected as described in the preceding diffusion treatments.

The resulting p-type layer 4 has a thickness of approximately $10\mu$ and a surface concentration of approxmately $5\times10^{18}$ acceptors per cu. cm. consisting of gallium.

Then the emiter contact 12, the base contact 11 and the collector contact 13 are provided in a manner commonly used in semiconductor technology and a mask is provided on the whole upper side and the lower side for a circular part having a diameter of approximately 5.6 mm. which contains the collector contact 13 having a diameter of approximately 4.6 mm. The outermost parts of the semiconductor body 1 bounded by the broken lines 14 are then removed by etching. Masking and etching may be effected in a manner commonly used in semiconductor technology.

The high-voltage transistor shown in FIGURE 1 is then obtained. In a manner commonly used in semiconductor technology the contacts 11, 12 and 13 may be provided with supply conductors and an envelope may be provided.

It is noted that during a diffusion treatment a zone obtained during a preceding diffusion treatment becomes somewhat thicker by further diffusion. In the transistor obtained according to FIGURE 1, the zones 2 and 6 have a thickness of approximately $20\mu$, the part 7 of the base zone 3, 4 has a thickness of approximately $30\mu$ and the high-ohmic collector layer 5 has a thickness of approximately $120\mu$. In the method described, a slow cooling is carried out after each diffusion treatment. Although this gives the most favourable results for obtaining a reasonable lifetime of the minority carriers in the base zone, slow cooling is essential only after the last diffusion treatment. In addition, the slow heating to the diffusion temperature has a favourable influence on the lifetime of the minority carrier in the base zone, but this slow heating is not necessary.

The high-voltage transistor described has a base-collector breakdown voltage (measured with the emitter current=0) of approximately 1400 v. The emitter-collector breakdown voltage (measured with base current=0) is approximately 800 v. at a temperature of 25° C. and approximately 600 v. at an operating temperature at approximately 125° C.

The amplification factor at a temperature of 25° C is more than 10 and at a temperature of 125° C. is more than 15.

The collector current may be up to approximately 1A.

High-voltage transistors of the type described are of importance inter alia for use as an amplifier element in the output stage in amplifiers in radio and television sets.

If a silicon semiconductor body having only a concentration of approximately $0.5\times10^{14}$ impurities determining the conductivity type per cu. cm. is used as the starting material and if it is ensured that the high-ohmic collector layer 5 obtains a thickness of approximately $200\mu$, a high-voltage transistor is obtained in which the base-collector breakdown voltage is more than 2000 volts, while the emitter-collector breakdown voltage becomes higher than 800 volts at a temperature of 125° C.

It is noted that an angle $\alpha$ (see FIGURE 1) between the base-collector junction surface 8 and the surface of the semiconductor body 1 smaller than 90° reduces the possibility of breakdown along the surface of the semiconductor body 1 at the junction surface 8. The angle $\alpha$ is preferably smaller than 45°.

It is to be noted that a high-voltage transistor according to the invention in further of importance for use in a circuit arrangement for producing a sawtooth current through the horizontal deflection coils of a picure tube, in which in the output circuit between the emitter and the collector electrodes E and C respectively (FIGURE 5) of the transistor $T_2$ the deflection coils $L_y$ are included, while through an inductive coupling 31 between the base and emitter electrodes B and E, respectively and in the example shown also through the transistor $T_1$, a pulsatory switching signal 30 is applied to the transistor $T_2$ which periodically cuts off and releases the transistor $T_2$, the duration of the pulses of the switching signal 30 which cut off the transistor $T_2$ being larger than the flyback period of the sawtooth current, so that at the beginning of the flyback period the current through the deflection coils $L_y$, which then is reversed with respect to the end of the stroke period, can flow through the released base-collector diode of the transistor $T_2$, while the supply voltage $V_H$ of the transistor is many times larger, for example, at least 10 times larger, than the peak-to-peak value of the switching signal 30 supplied between the base and emitter electrodes B and E respectively. Such a circuit arrangement is described in detail in copending patent application Ser. No. 579,539, filed Sept. 15, 1966.

It will be clear that the invention is not restricted to the examples described and that many variations are possible for those skilled in the art without departing from the scope of this invention. For example, instead of a silicon semiconductor body, a semiconductor body consisting of a $A^{III}B^{V}$-compound, for example, aluminum phosphide, gallium arsenide and indium phosphide may be used. In addition, the high-voltage transistor may be a pnp instead of a npn-transistor. The base zone and/or the emitter zone may be zones obtained by epitaxial methods instead of zones obtained by diffusion methods.

What is claimed is:

1. A transistor exhibiting high collector breakdown voltage comprising a semiconductor body of semiconductive material having between its valence and conduction bands a forbidden gap whose width is at least equal to that of silicon, said body comprising in the order named an emitter zone of one type conductivity, a base zone of the opposite type conductivity forming with the emitter zone an emitter-base p-n junction, a first collector zone of said one type conductivity forming with the base region a base-collector p-n junction spaced from the emitter-base junction, and a second collector zone of said one type conductivity, and emitter, base and collector connections to said emitter zone, base zone and second collector zone, respectively, said first collector zone having a high resistivity compared with that of the second collector zone and a content of one type determining impurities of a most $2.5\times10^{14}$ per cubic centimeter, said first collector zone having a thickness in the direction of the successive zones of between 80 and 300 microns, the base zone viewed in the direction of its thickness in the direction of the successive zones containing more than $2\times10^{12}$ per square centimeter of opposite-type determining impurities, at least the part of the base zone located between the emitter and first collector zones having a thickness between 15 and 60 microns.

2. A transistor as set forth in claim 1 wherein the whole emitter-base junction is substantially parallel to the base-collector junction, said junctions being substantially flat.

3. A transistor as set forth in claim 2 wherein both the emitter and base zones have a graded distribution of impurities declining in the direction toward the collector zones.

4. A transistor as set forth in claim 3 wherein the emitter zone has a small lateral extent than the base zone, and the base zone surface portions not covered by the emitter zone have a higher impurity concentration than that of the covered base zone portions, and the base connection is made to the base zone portions not covered by the emitter zone.

5. A transistor exhibiting high collector breakdown voltage comprising a semiconductor body of semiconductive material having between its valence and conduction bands a forbidden gap whose width is at least equal to that of silicon, said body comprising in the order named an emitter zone of one type conductivity, a base zone of the opposite type conductivity forming with the emitter zone a flat emitter-base p-n junction, a first collector zone of said one type conductivity forming with the base region a flat base-collector p-n junction uniformly spaced from the emitter-base junction, and a second collector zone of said one type conductivity, and emitter, base and collector connections to said emitter zone, base zone and second collector zone, respectively, said first collector zone having a high resistivity compared with that of the second collector zone and a content of one-type determining impurities of at most $1.6 \times 10^{14}$ per cubic centimeter, said first collector zone having a thickness in the direction of the successive zone of between 100 and 250 microns, the base zone, viewed in the direction of its thickness in the direction of the successive zones containing at least $10^{13}$ per square centimeter of opposite-type determianing impurities, at least the part of the base zone located between the emitter and first collector zones having a thickness between 20 and 55 microns.

6. A transistor as set forth in claim 5 wherein he first collector zone has a thickness of approximately 120 microns and contains approximately $1.4 \times 10^{14}$ one-type determining impurities per cubic centimeter, the base zone has a thickness of approximately 30 microns and an impurity concentration at the surface adjacent the emitter of opposite type impurities of approximately $10^{18}$ per cubic centimeter.

7. A method of manufacturing a high-voltage transistor as claimed in one or more of the preceding claims, in which a semiconductor body is used as a starting material, in which at least one of the regions consisting of the base zone, the surface layer of the base zone and the emitter zone is provided by a diffusion treatment at a diffusion temperature exceeding 1000° C. followed by cooling the semiconductor body, characterized in that at least after the last diffusion treatment the semiconductor body is slowly cooled at a rate of at most 20° C.

per minute at least to a temperature between 600° C. and 1000° C.

8. A method as claimed in claim 7, characterized in that the semiconductor body is slowly cooled at a rate of at most 3° C. per minute.

9. A method as claimed in claim 7 or 8, characterized in that the semiconductor body is slowly cooled to at least a temperature of 850° C.

10. A method as claimed in one or more of the claims 7 to 9, characterized in that during the manufacture of the high-voltage transistor the slow cooling of the semiconductor body is carried out after each diffusion treatment.

11. A method as claimed in one or more of the claims 7 to 10, characterized in that at least in the last diffusion treatment the semiconductor body is heated from a temperature between 600° C. and 1000° C. to the diffusion temperature at approximately the same rate at which the semiconductor body is slowly cooled after the diffusion treatment.

References Cited

UNITED STATES PATENTS

| | | | |
|---|---|---|---|
| 3,270,255 | 8/1966 | Nakatogawa | 317—234 |
| 3,277,351 | 10/1966 | Osafune | 317—234 |
| 3,344,323 | 9/1967 | Einthoven | 317—235 |

JOHN W. HUCKERT, *Primary Examiner.*

M. EDLOW, *Assistant Examiner.*

U.S. Cl. X.R.

307—299; 317—234